United States Patent
Rosenberg et al.

(10) Patent No.: US 11,099,137 B2
(45) Date of Patent: Aug. 24, 2021

(54) VISUALIZATION OF THREE-DIMENSIONAL SEMICONDUCTOR STRUCTURES

(71) Applicant: KLA Corporation, Milpitas, CA (US)

(72) Inventors: Aaron J. Rosenberg, Mountain View, CA (US); Jonathan Iloreta, Menlo Park, CA (US); Thaddeus G. Dziura, San Jose, CA (US); Antonio Gellineau, Santa Clara, CA (US); Yin Xu, Shanghai (CN); Kaiwen Xu, Shanghai (CN); John Hench, Los Gatos, CA (US); Abhi Gunde, Fremont, CA (US); Andrei Veldman, Sunnyvale, CA (US); Liequan Lee, Fremont, CA (US); Houssam Chouaib, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/006,450

(22) Filed: Aug. 28, 2020

(65) Prior Publication Data

US 2020/0393386 A1   Dec. 17, 2020

Related U.S. Application Data

(63) Continuation of application No. 16/283,690, filed on Feb. 22, 2019, now Pat. No. 10,794,839.

(51) Int. Cl.
*G01N 21/00* (2006.01)
*G01N 21/95* (2006.01)
(Continued)

(52) U.S. Cl.
CPC ... *G01N 21/9501* (2013.01); *G01N 21/95607* (2013.01); *G06F 30/39* (2020.01);
(Continued)

(58) Field of Classification Search
CPC ............. G01N 21/9501; G01N 21/956; G01N 21/95607; G01N 21/94; G01N 21/8806
(Continued)

(56) References Cited

U.S. PATENT DOCUMENTS

| 5,608,526 A | 3/1997 | Piwonka-Corle et al. |
| 5,859,424 A | 1/1999 | Norton et al. |

(Continued)

FOREIGN PATENT DOCUMENTS

JP    2014130077 A    7/2014

OTHER PUBLICATIONS

P. Lemaillet et al., "Intercomparison between optical and x-ray scatterometry measurements of FinFET structures," Proc. SPIE, vol. 8681, 86810Q (Apr. 2013).

(Continued)

*Primary Examiner* — Md M Rahman
(74) *Attorney, Agent, or Firm* — Huse IP Law; Charles C. Huse

(57) ABSTRACT

A semiconductor metrology tool inspects an area of a semiconductor wafer. The inspected area includes a plurality of instances of a 3D semiconductor structure arranged periodically in at least one dimension. A computer system generates a model of a respective instance of the 3D semiconductor structure based on measurements collected during the inspection. The computer system renders an augmented-reality or virtual-reality (AR/VR) image of the model that shows a 3D shape of the model and provides the AR/VR image to an AR/VR viewing device for display.

21 Claims, 9 Drawing Sheets

(51) Int. Cl.
*H01L 27/02* (2006.01)
*H01L 27/088* (2006.01)
*H01L 27/108* (2006.01)
*G06T 17/10* (2006.01)
*G06T 15/20* (2011.01)
*G01N 21/956* (2006.01)
*H01L 27/115* (2017.01)
*G06F 30/39* (2020.01)

(52) U.S. Cl.
CPC ............ *G06T 15/205* (2013.01); *G06T 17/10* (2013.01); *H01L 27/0207* (2013.01); *H01L 27/0886* (2013.01); *H01L 27/108* (2013.01); *H01L 27/115* (2013.01); *G06T 2207/20081* (2013.01); *G06T 2207/30148* (2013.01)

(58) Field of Classification Search
USPC ...................................................... 356/237.5
See application file for complete search history.

(56) References Cited

U.S. PATENT DOCUMENTS

| | | |
|---|---|---|
| 6,429,943 B1 | 8/2002 | Opsal et al. |
| 7,478,019 B2 | 1/2009 | Zangooie et al. |
| 7,929,667 B1 | 4/2011 | Zhuang et al. |
| 7,933,026 B2 | 4/2011 | Opsal et al. |
| 9,291,554 B2 | 3/2016 | Kuznetsov et al. |
| 9,581,430 B2 | 2/2017 | Manassen et al. |
| 9,739,702 B2 | 8/2017 | Bringoltz et al. |
| 9,915,522 B1 | 3/2018 | Jiang et al. |
| 2004/0249809 A1 | 12/2004 | Ramani et al. |
| 2009/0296073 A1 | 12/2009 | Wagganer |
| 2012/0043611 A1 | 2/2012 | Mouli et al. |
| 2013/0222371 A1 | 8/2013 | Reitan |
| 2014/0019097 A1 | 1/2014 | Bakeman et al. |
| 2014/0172394 A1 | 6/2014 | Kuznetsov et al. |
| 2014/0253913 A1 | 9/2014 | Bergman et al. |
| 2014/0282328 A1* | 9/2014 | Fried .................... G06F 30/398 716/112 |
| 2014/0297211 A1 | 10/2014 | Pandev et al. |
| 2014/0316730 A1 | 10/2014 | Shchegrov et al. |
| 2015/0058813 A1 | 2/2015 | Kim et al. |
| 2015/0110249 A1 | 4/2015 | Bakeman et al. |
| 2015/0117610 A1 | 4/2015 | Veldman et al. |
| 2015/0199463 A1 | 7/2015 | Iloreta et al. |
| 2015/0300965 A1 | 10/2015 | Sezginer et al. |
| 2016/0035538 A1 | 2/2016 | Fukuda |
| 2016/0058406 A1 | 3/2016 | Lee et al. |
| 2016/0139032 A1 | 5/2016 | Rampoldi et al. |
| 2016/0202193 A1 | 7/2016 | Hench et al. |
| 2016/0290934 A1 | 10/2016 | Wells et al. |
| 2016/0307116 A1 | 10/2016 | Kaushal et al. |
| 2016/0350445 A1 | 12/2016 | Dowski, Jr. et al. |
| 2017/0167862 A1 | 6/2017 | Dziura et al. |
| 2017/0365085 A1 | 12/2017 | Moll et al. |
| 2018/0106735 A1 | 4/2018 | Gellineau et al. |
| 2018/0365370 A1* | 12/2018 | Egan .................... G06F 3/04815 |

OTHER PUBLICATIONS

PCT/US2019/020470, International Search Report, dated Jun. 12, 2019.

PCT/US2019/020470, Written Opinion of the International Searching Authority, dated Jun. 12, 2019.

R. Joseph Kline et al., "X-ray scattering critical dimensional metrology using a compact x-ray source for next generation semiconductor devices," J. Micro/Nanolith. MEMS MOEMS 16(1), 014001 (2017).

* cited by examiner

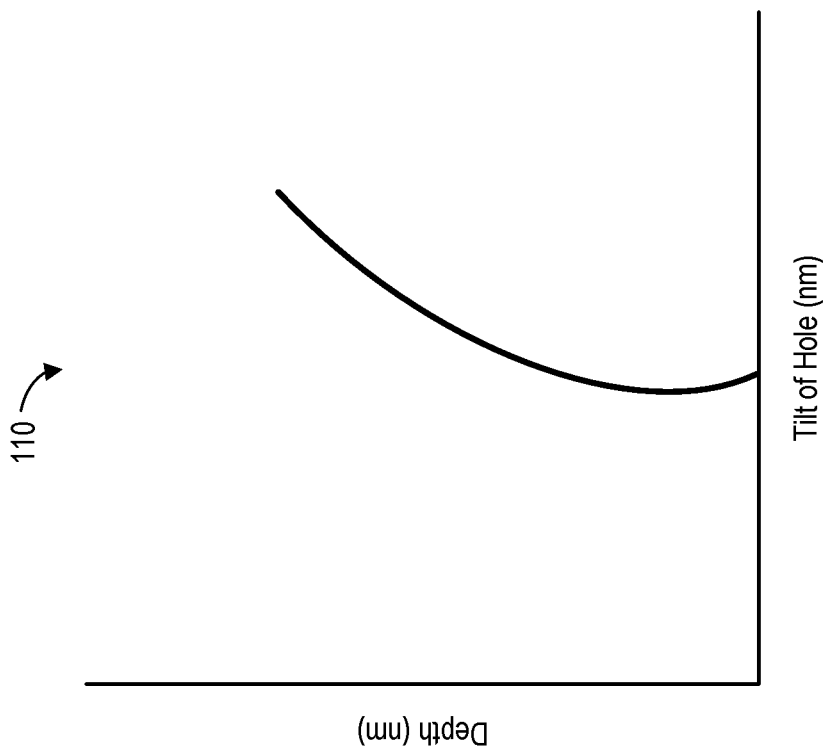
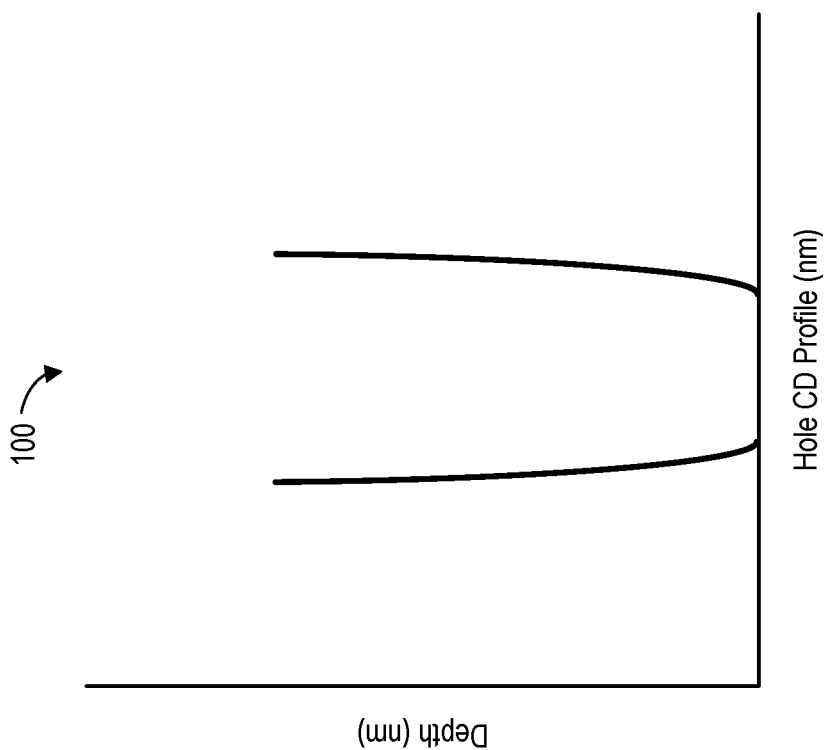

VISUALIZATION OF THREE-DIMENSIONAL SEMICONDUCTOR STRUCTURES

RELATED APPLICATION

This application is a continuation of U.S. patent application Ser. No. 16/283,690, filed on Feb. 22, 2019, which is incorporated by reference in its entirety for all purposes.

TECHNICAL FIELD

This disclosure relates to semiconductor metrology, and more specifically to generating visualizations that show the three-dimensional (3D) nature of semiconductor structures.

BACKGROUND

Three-dimensional semiconductor structures may be characterized using various types of metrology, such as different types of optical metrology and small-angle x-ray scattering (SAXS). Inadequate visualization of the resulting measurements, however, may cause data to be overlooked or not fully appreciated. Such data may be important for debugging a semiconductor manufacturing process, improving yield and reliability for the process, or predicting performance of a semiconductor device. Inadequate visualization also makes comparisons to reference data, such as data from critical-dimension scanning electron microscopy (CD-SEM) and transmission electron microscopy (TEM) difficult.

SUMMARY

Accordingly, there is a need for improved techniques for visualizing 3D semiconductor structures. Examples of such structures include, without limitation, memory holes in 3D memories (e.g., 3D flash memories), finFETs, and DRAM cells.

In some embodiments, a method of semiconductor-structure visualization includes, in a semiconductor metrology tool, inspecting an area of a semiconductor wafer. The semiconductor wafer may include at least one of semiconductor logic circuitry or semiconductor memory circuitry. The inspected area includes a plurality of instances of a 3D semiconductor structure arranged periodically in at least one dimension. The method also includes, in a computer system comprising one or more processors and memory storing instructions for execution by the one or more processors, generating a model of a respective instance of the 3D semiconductor structure based on the inspecting. The method further includes, in the computer system, rendering an image of the model that shows a 3D shape of the model and providing the image to a device for display.

In some embodiments, a semiconductor-inspection system includes a semiconductor metrology tool and a computer system with one or more processors and memory storing one or more programs for execution by the one or more processors. The one or more programs include instructions for performing all or a portion of the above method. In some embodiments, a non-transitory computer-readable storage medium stores one or more programs configured for execution by a computer system. The one or more programs include instructions for performing all or a portion of the above method.

BRIEF DESCRIPTION OF THE DRAWINGS

For a better understanding of the various described embodiments, reference should be made to the Detailed Description below, in conjunction with the following drawings.

FIG. 1A shows a graph that displays variation of the CD profile of a memory hole along its depth.

FIG. 1B shows a graph that displays the tilt of a memory hole along its depth.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

FIG. 1A shows a graph 100 that displays variation of the critical-dimension (CD) profile (e.g., the diameter) of a memory hole along its depth. The memory hole extends vertically through a three-dimensional (3D) semiconductor memory structure (e.g., 3D flash memory), with the vertical direction (in other figures, the z-axis) corresponding to depth. The CD profile is measured in nanometers (nm). The graph 100 corresponds to a vertical cross-section of the memory hole.

FIG. 1B shows a graph 110 that displays the tilt of a memory hole along its depth. Ideally the tilt should be zero, such that the graph shows a straight vertical line. In practice, however, the memory hole at any given depth may have an offset with respect to the hole at its surface. This offset, measured in nanometers, is the tilt. The tilt at a given depth may be determined by measuring the offset between a specified point on the surface of the memory hole (e.g., its center, a specific point on its circumference, etc.) and a corresponding point at that depth.

The low dimensionality of the graphs 100 and 110—each shows variation of a parameter along a single dimension—limits the information they convey. Each of the graphs 100 and 110 provides only a limited indication of the shape of the memory hole. More robust visualization methods that solve this problem by providing a sense of the 3D shape of the memory hole, or of another semiconductor structure, will now be described.

Figure 2:
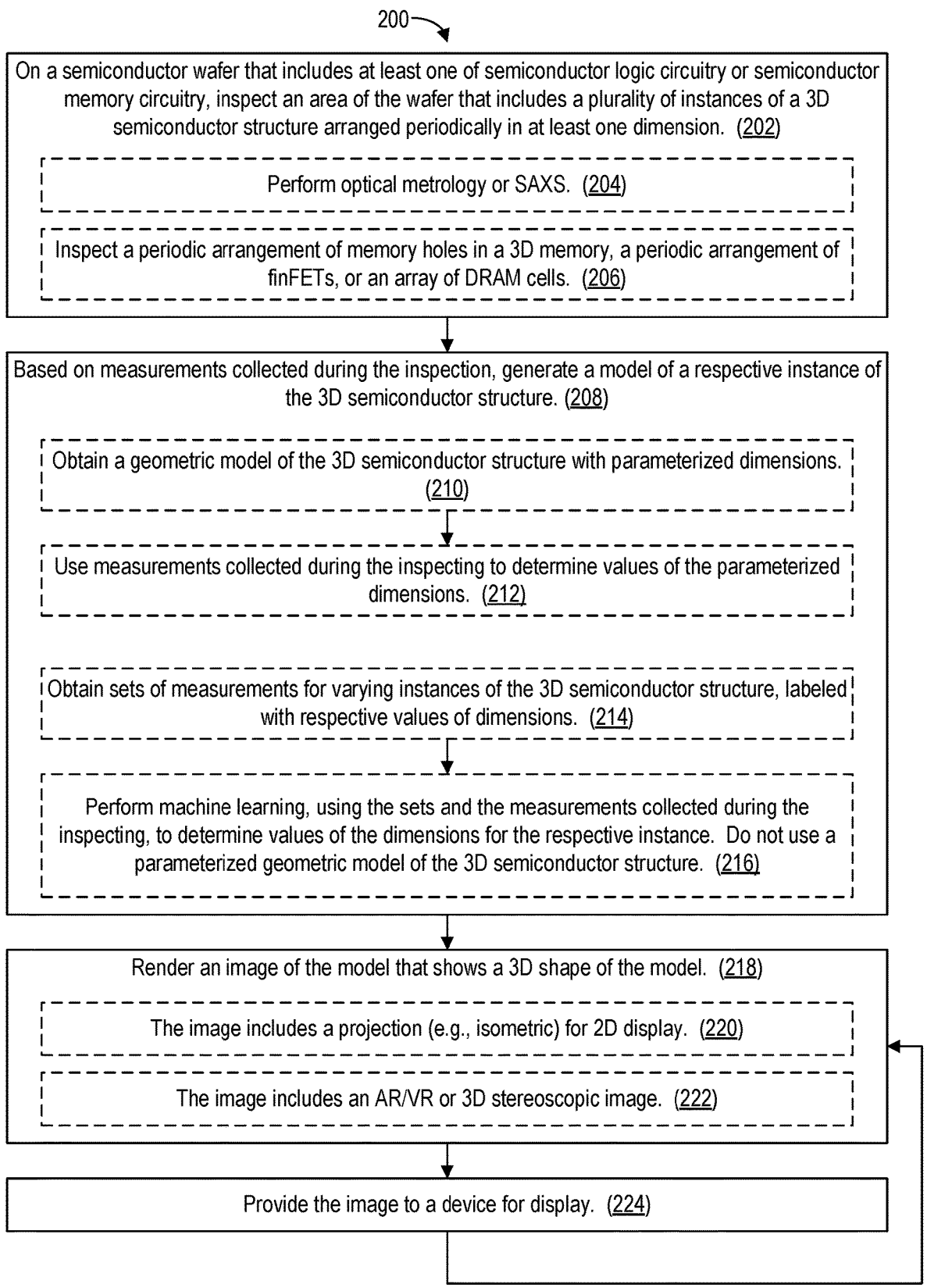
FIG. 2 shows a flowchart of a method of semiconductor-structure visualization in accordance with some embodiments.

FIG. 2 shows a flowchart of a method 200 of semiconductor-structure visualization in accordance with some embodiments. The method 200 produces images that show 3D shapes and thus avoid the shortcomings of the graphs 100 and 110 (FIGS. 1A and 1B). The method 200 is described with reference to FIGS. 3A-8, which give examples of images that show 3D shapes of semiconductor structures. (Technically, the images show models of semiconductor structures, wherein the models are generated based on the results of semiconductor metrology, as described below.) Steps in the method 200 may be combined or broken out.

In the method 200, a semiconductor metrology tool (e.g., the metrology tool 1032, FIG. 10) is used to inspect (202) an area of a semiconductor wafer. The semiconductor wafer includes at least one of semiconductor logic circuitry or semiconductor memory circuitry. The circuitry may be only partially fabricated at the time of inspection. The area that is inspected includes a plurality of instances of a 3D semiconductor structure arranged periodically in at least one dimension (e.g., in only one dimension or in two dimensions). Optical metrology or small-angle x-ray scattering (SAXS) may be performed (204) to inspect the area. Examples of optical-metrology techniques that may be performed include spectroscopic ellipsometry, single-wavelength ellipsometry, beam-profile ellipsometry, beam-profile reflectometry, single-wavelength reflectometry, angle-resolved reflectometry, spectroscopic reflectometry, scatterometry, and Raman spectroscopy. Examples of SAXS techniques that may be performed include transmissive SAXS, reflective SAXS, and grazing incidence SAXS.

In some embodiments, the 3D semiconductor structure is a memory hole in a 3D memory (e.g., 3D flash memory), a fin field-effect transistor (finFET) or portion thereof, or a dynamic random-access memory (DRAM) cell or portion thereof. A memory hole may be inspected when it is empty (e.g., after etch but before fill), filled, or at some intermediate step between etch and complete fill. Likewise, other structures may be inspected at various steps in their fabrication processes. The inspected area therefore may include (206) a periodic arrangement of memory holes in a 3D memory, a periodic arrangement of finFETs, or an array of DRAM cells. Alternatively, other 3D semiconductor structures may be inspected.

Figure 10:
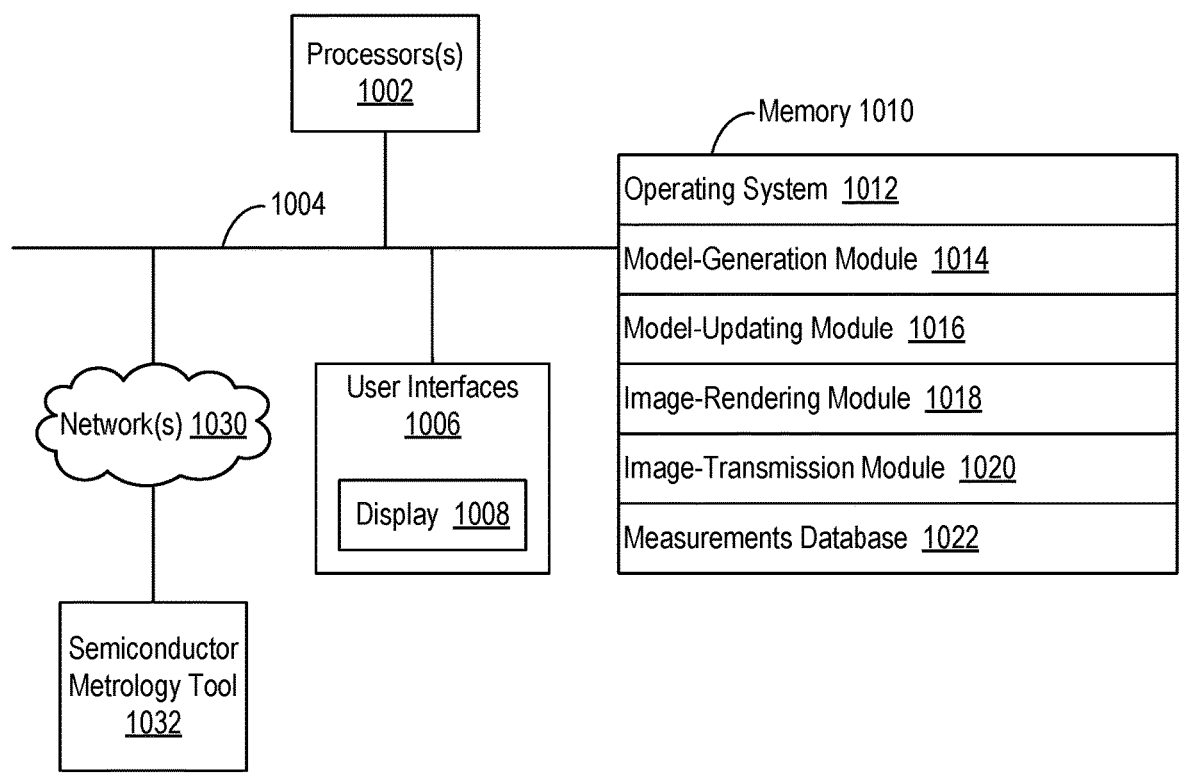
FIG. 10 is a block diagram of a semiconductor-inspection system in accordance with some embodiments.

The steps following steps 202, 204, and/or 206 (i.e., steps 208 and on) are performed in a computer system communicatively coupled with the metrology tool (e.g., the computer system of the semiconductor-inspection system 1000, FIG. 10).

Based on measurements collected during the inspection step 202, a model of a respective instance of the 3D semiconductor structure is generated (208). In some embodiments, the respective instance is or includes a respective memory hole, a respective finFET or portion thereof, or a respective DRAM cell or portion thereof, in accordance with step 206.

In some embodiments, to generate this model, a geometric model of the 3D semiconductor structure with parameterized dimensions (i.e., a parameterized geometric model) is obtained (210). The geometric model may also include information about material properties, and thus be a parameterized geometric/material model. The parameterized geometric model (e.g., geometric/material model) is typically created in advance, before the inspection step 202. Measurements collected during the inspection step 202 are used (212) to determine values of the parameterized dimensions. This determination may be made by performing regression on the parameters of the geometric model (e.g., geometric/material model). For example, this determination may be made using a machine-learning model trained using training sets of measurements, actual and/or simulated, for which corresponding parameter values for the parameterized geometric model (e.g., geometric/material model) have been determined.

In some other embodiments, to generate this model, sets of measurements (actual and/or simulated) for varying instances of the 3D semiconductor structure are obtained (214). Each set is labeled with respective values of dimensions. Machine learning is performed, using the set and the measurements collected during the inspection step 202, to determine (216) values of the dimensions for the respective instance. A parameterized geometric model of the 3D semiconductor structure is not used.

An image of the model is rendered (218) that shows a 3D shape of the model. The image may show a partial 3D shape of the model, for example because one or more surfaces and/or sides are obscured or absent, and/or because the image includes a limited number of cross-sections. Alternatively, the image may show the full 3D shape of the model, for example using augmented reality or virtual reality (AR/VR) or holography. The model and image may be voxelated, such that they are built up using voxels (volume elements, which are the 3D equivalent of pixels). The image is provided (224) to a device for display. In one example, the image is provided to a display screen (e.g., display 1008, FIG. 10) of the computer system that performs steps 208-224. In another example, the image is transmitted to a different electronic device (e.g., a client computer or mobile electronic device with a display, an AR/VR viewer, a 3D stereoscopic viewer, a holographic display system, etc.) for display. In still another example, the image is transmitted to a 3D printer, which may additively manufacture an object having the shape of the model, thereby displaying the 3D shape of the model.

In some embodiments, the image includes (220) a projection for two-dimensional (2D) display. For example, the projection may be an axonometric projection (e.g., an isometric projection, dimetric projection, or trimetric projection) showing multiple sides of the model. The dimensions of the projection thus may share a common scale or have different scales. While the projection is to be displayed in 2D, it shows a 3D shape of the model (although not the entire 3D shape in accordance with some embodiments, because some sides and/or surfaces may be obscured by the visible sides and/or surfaces).

Figure 3B:
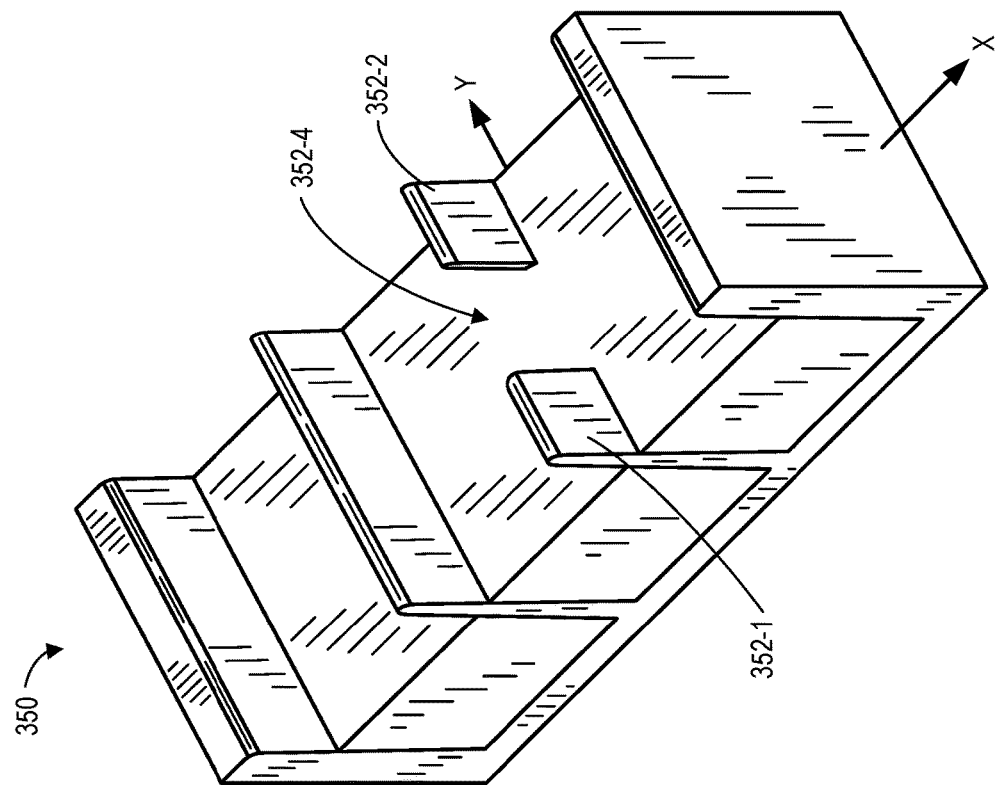
FIG. 3B shows an image that is an isometric projection of modeled portions of two finFETs in accordance with some embodiments.
Figure 3A:
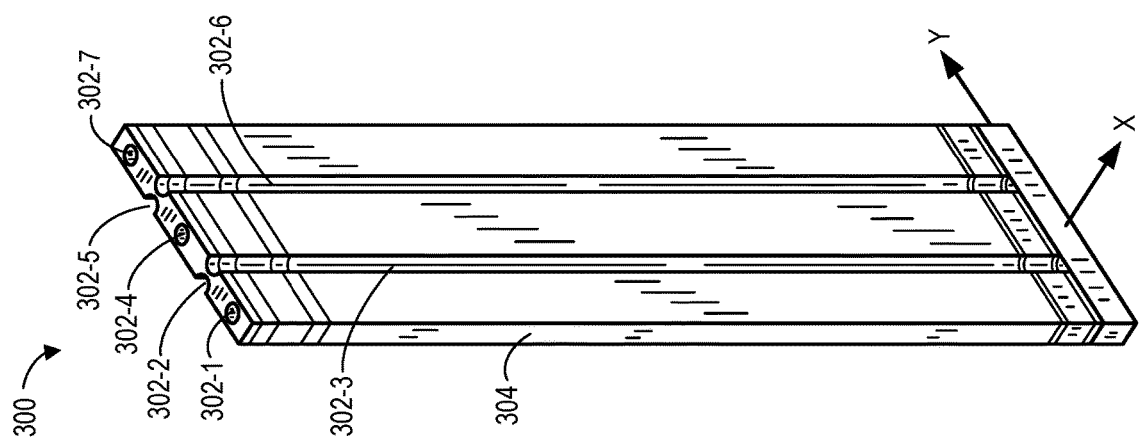
FIG. 3A shows an image that is an isometric projection of a modeled slice of a 3D semiconductor memory device with a plurality of memory holes in accordance with some embodiments.

FIG. 3A shows an image 300 that is an isometric projection of a modeled slice 304 of a 3D semiconductor memory device (e.g., a 3D flash memory) with a plurality of memory holes 302-1 through 302-7 in accordance with some embodiments. The slice 304 may comprise multiple layers (e.g., a series of alternating oxide ($SiO_2$) and nitride ($Si_3N_4$) layers) through which the memory holes 302 extend vertically. The image 300 only shows the 2D top surfaces of memory holes 302-1, 302-4, and 302-7, but shows cut-away views of memory holes 302-2, 302-3, 302-5, and 302-6. The cut-away views of the memory holes 302-3 and 302-6 show the 3D shapes of their back halves with respect to the plane through which they have been sliced. The image 300 is thus an example of the image of step 220. The 3D shapes of the memory holes 302-3 and 302-6 may be shown using contour lines (as in FIG. 3A), shading, coloring, or other appropriate graphical techniques for 2D projections of 3D objects. The image 300 is thus an example of the image of step 220.

FIG. 3B shows an image 350 that is an isometric projection of modeled portions of two finFETs in accordance with some embodiments. The first finFET has a channel 352-1 and the second finFET has a channel 352-2. The channels 352 are separated by a gap 354 that isolates the two finFETs. As for the memory holes 302-3 and 302-6 of FIG. 3A, the 3D shapes of these structures may be shown using contour lines (as in FIG. 3B), shading, coloring, or other appropriate graphical techniques. The image 350 is another example of the image of step 220.

As the images 300 and 350 show, the image of steps 218 and 224 may show the 3D shape of multiple instances of a semiconductor structure or portions thereof (e.g., multiple instances of memory holes 302 or channels 352).

Figure 4D:
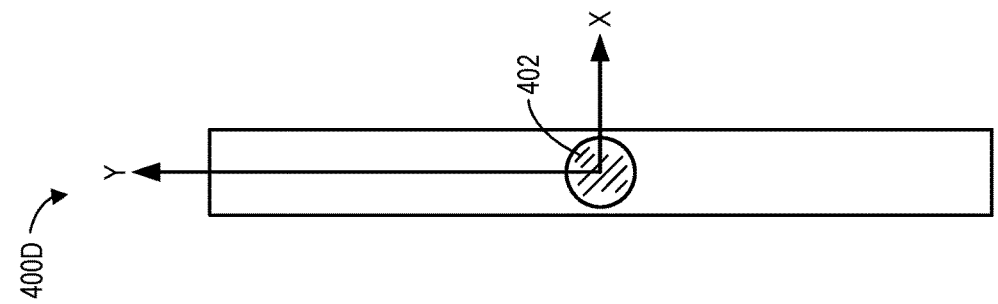
FIGS. 4A-4D show images of a modeled memory hole, rendered from different perspectives in accordance with some embodiments.
Figure 4C:
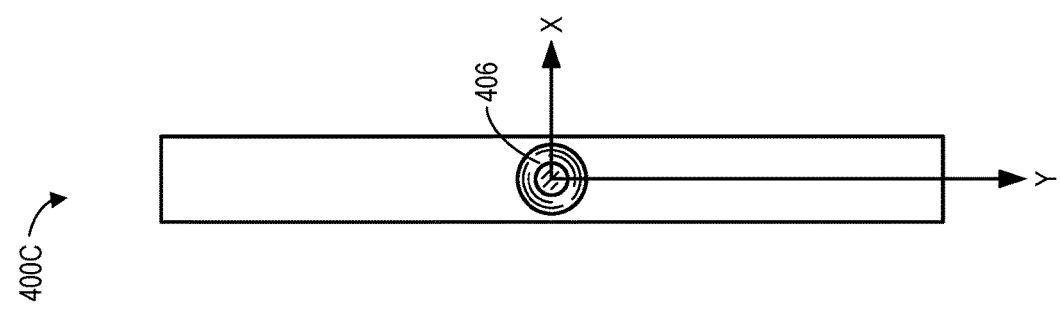
Figure 4B:
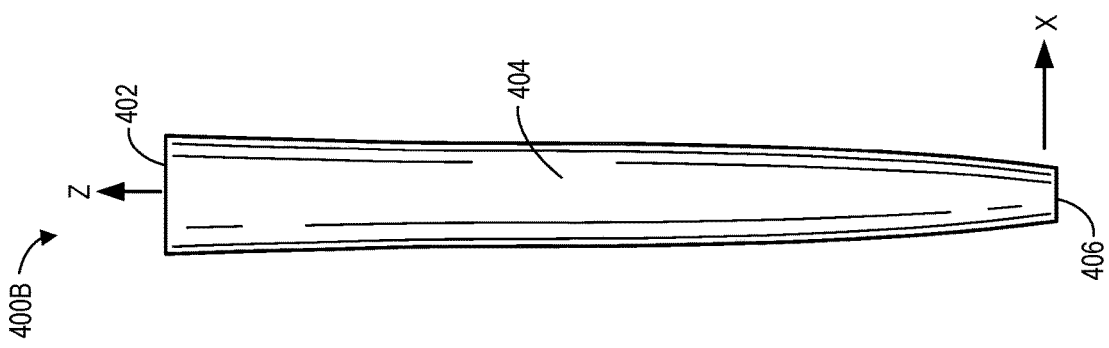
Figure 4A:
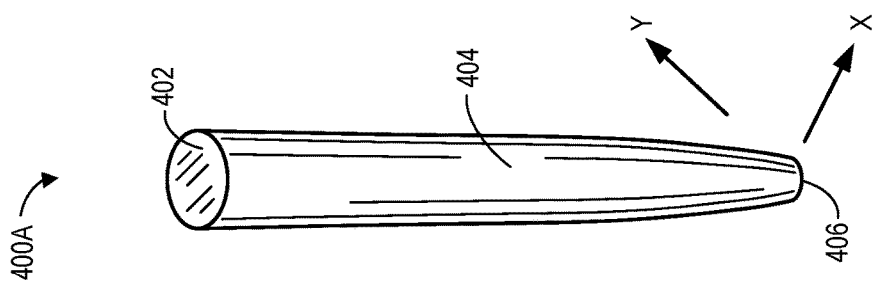

In some embodiments, the perspective of the image may be varied in response to user input 226. FIG. 4A shows an image 400A of a modeled memory hole, rendered from a first perspective in accordance with some embodiments. From the first perspective, the image 400A shows the top surface 402 and front-side surface 404 of the memory hole. The use of contour lines (or shading, coloring, etc.) shows a 3D shape of the memory hole: the image 400A shows the 3D curvature of the front-side surface 404. The bottom surface 406 and back-side surface of the memory hole are obscured in this perspective. In response to receiving user input 226 specifying a change in perspective, the computer system performing the method 400 renders (218) a new image 400B, 400C, or 400D from the changed perspective and provides (224) the new image 400B, 400C, or 400D to the user's device for display. (Alternatively, the new image may have been rendered and stored before the user input 226 is received, and is provided in response to the user input 226). This process may be performed iteratively to allow the user to view the memory hole from multiple perspectives (e.g., to view the images 400B, 400C, and/or 400D in turn). For example, the user may rotate the view of the memory hole in specified directions. The image 400B is a side view that shows the 3D curvature of the front-side surface 404 but does not show top surface 402, bottom surface 406, or back-side surface. The image 400C is a bottom view that shows only the bottom surface 406. The image 400D is a top view that shows only the top surface 402. The images 400C and 400D are not examples of the image of step 218, because they do not show a 3D shape, but they would be if rotated slightly to show a side surface or portion thereof.

In some embodiments, instead of varying the perspective from which the image is rendered, the model itself may be varied in response to user input 226 (e.g., such that the arrow labeled with "user input 226" points back to step 208 instead of step 218). For example, the user input 226 may specify changes to one or more dimensions (e.g., distances) or angles of the model of the respective instance. The model is updated in response to the user input 226, such that it no longer corresponds to the measurements collected during the inspection of step 202. An image of the updated model is then rendered and sent to the user's device for display. This modification allows the user to explore how much margin the semiconductor structure has before reaching a point of failure (e.g., before adjacent conductive structures short out). The image of the updated model may be annotated to indicate the update(s) to the model (e.g., to indicate the dimensional changes, changes to one or more angles, etc.). Annotations may be user-driven (e.g., indicating specified distances or angles, in accordance with the user input 226).

Figure 5B:
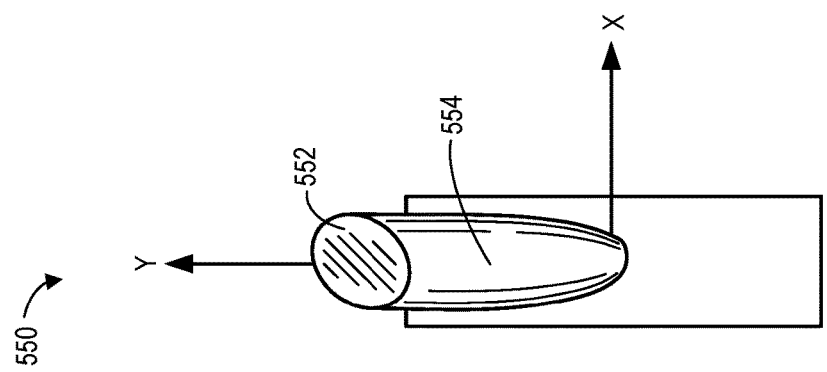
FIGS. 5A and 5B show images that are perspective views of respective modeled memory holes in accordance with some embodiments.
Figure 5A:
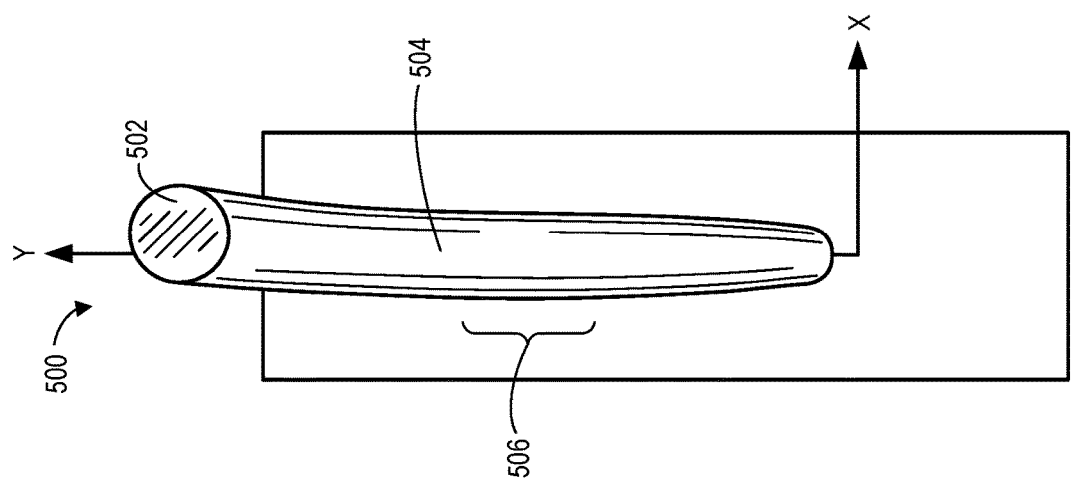

FIG. 5A shows an image 500 that is a perspective view of a modeled memory hole in accordance with some embodiments. Like the image 400A (FIG. 4A), the image 500 shows a top surface 502 and the 3D curvature of a front-side surface 504 of the memory hole. But the image 500 also shows tilt, whereas the memory hole of the image 400A lacked tilt (i.e., the tilt was substantially zero, such that the memory hole was substantially straight in the vertical direction). A top portion of the memory hole in the image 500 slants downward at an oblique angle, until a bend 506 in a middle portion of the memory hole, where the memory hole bends toward the vertical. A bottom portion of the memory hole than extends downward without substantial slant. If tilt is defined as an offset with respect to the top surface, as discussed for FIG. 1B, then the tilt of the bottom portion below the bend 506 is substantially constant.

FIG. 5B shows an image 550 that is a perspective view of a different modeled memory hole in accordance with some embodiments. Like the images 400A (FIG. 4A) and 500 (FIG. 5), the image 550 shows a top surface 552 and the 3D curvature of a front-side surface 554 of the memory hole. The image 550 shows that the top surface 552 is elliptical. The shape of the front-side surface 554 suggests that the memory hole retains this elliptical shape as it extends downward.

Figure 6:
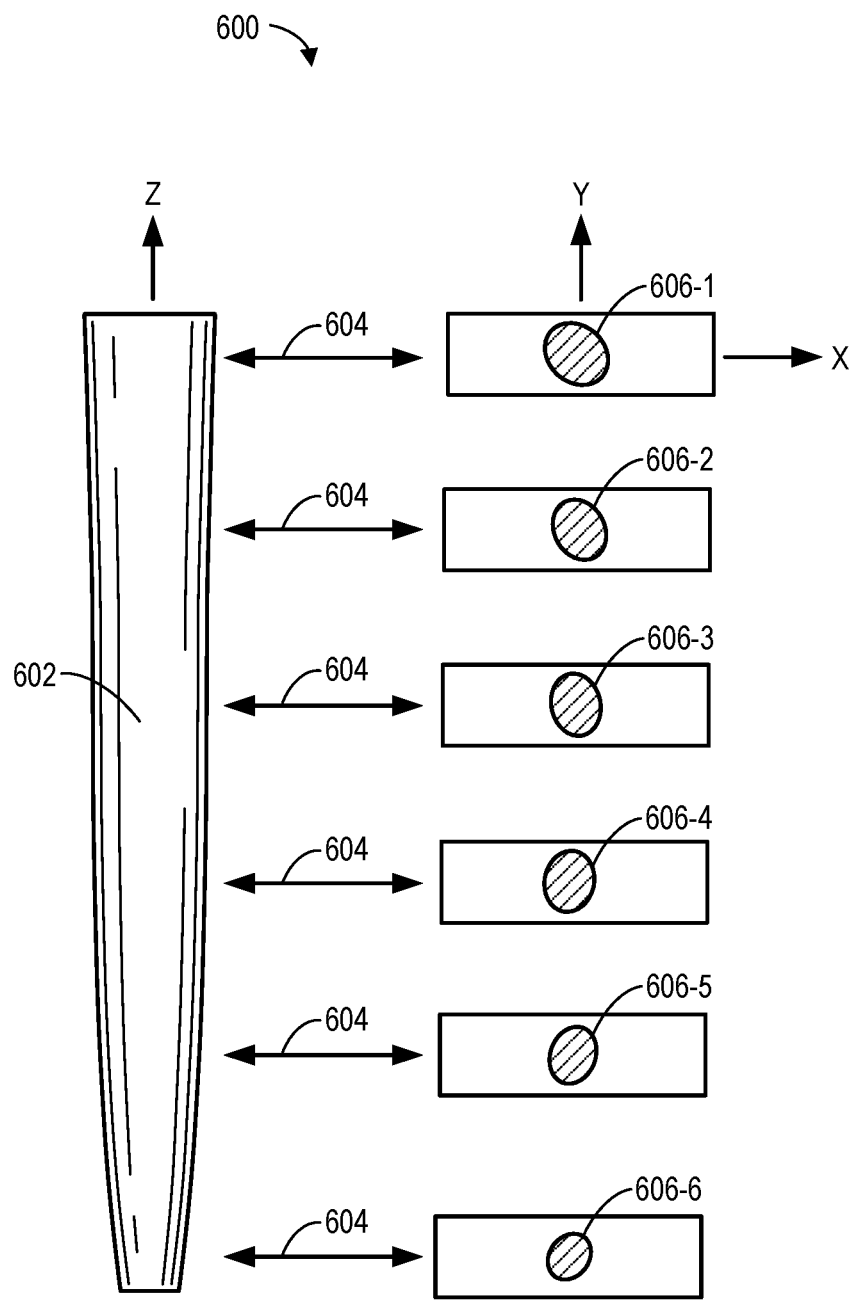
FIG. 6 shows an image that includes a perspective view of a modeled memory hole along with cross-sections of the model at various depths, in accordance with some embodiments.

In some embodiments in which the respective instance of the 3D semiconductor structure is a respective memory hole, the image shows the elliptical shape of the respective memory hole for multiple cross-sections (e.g., horizontal cross-sections) of the memory hole. The image may also show the helicity of the respective memory hole and/or the tilt of the memory hole for the multiple cross-sections. The helicity indicates change in orientation of the elliptical shape and may be defined as a degree of rotation of the major (or equivalently, the minor) axis of the ellipse with respect to the top surface (e.g., as measured in degrees or radians). For example, FIG. 6 shows an image 600 that includes a perspective view (here, a side view 602) of a modeled memory hole along with cross-sections 606-1 through 606-6 of the memory hole at various depths, in accordance with some embodiments. The arrows 604 between the side view 602 and respective cross-sections 606 indicate the depths for the respective cross-sections 606. The cross-sections 606 show the size (e.g., the CD) and elliptical shape of the memory hole at the various depths. The cross-sections 606 also show the helicity of the memory hole at the various depths: the ellipses of the cross-sections 606 rotate as the depth increases. While the memory hole in FIG. 6 has substantially zero tilt, the cross-sections 606 could also show tilt if it were present, for example by having varied positions within their surrounding rectangles to demonstrate the offset with respect to the top surface.

In some embodiments, the image highlights or otherwise indicates deviation from an elliptical shape for the multiple cross-sections. For example, a particular cross section 606 may not be precisely elliptical. The portion of the cross-section that deviates from an ellipse (e.g., falls outside of the ellipse or fails to reach the edge of the ellipse) may be highlighted (e.g., shown with a particular color, shade, or fill pattern). More generally, the image may highlight or otherwise indicate deviation of the 3D shape or a portion thereof (e.g., a cross-section) from a nominal shape. A memory hole and ellipse are merely one example of a respective structure and nominal shape for which such deviation may be displayed. Other examples are possible.

In some embodiments, cross-sections may be shown such that they appear to be arranged along an axis (e.g., the z-axis, corresponding to depth), with the axis appearing to intersect the page at a slant (i.e., at an oblique angle). In this arrangement, the cross-sections may partially overlap (e.g., with respective cross-sections partially obscuring successive cross-sections).

Figure 7A:
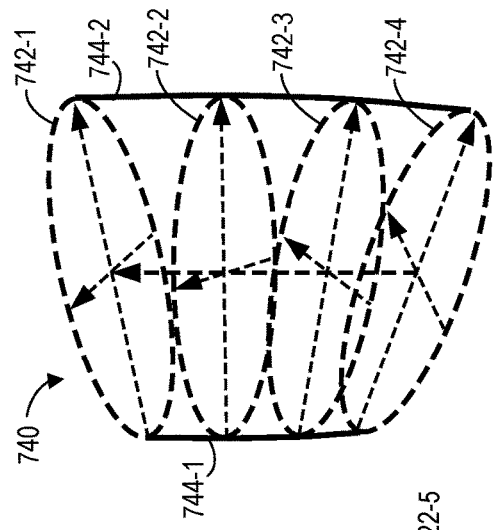
FIGS. 7A-7C show skeleton views of respective modeled memory holes in accordance with some embodiments.
Figure 7B:
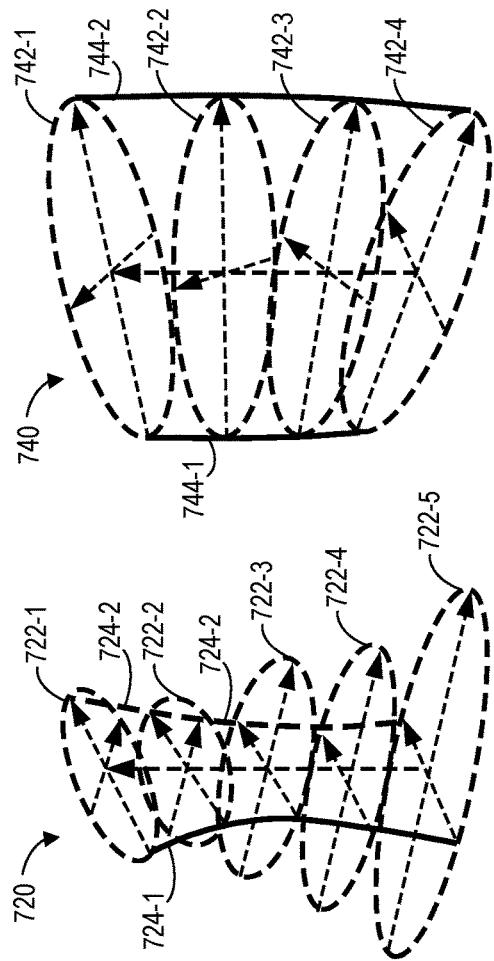
Figure 7C:
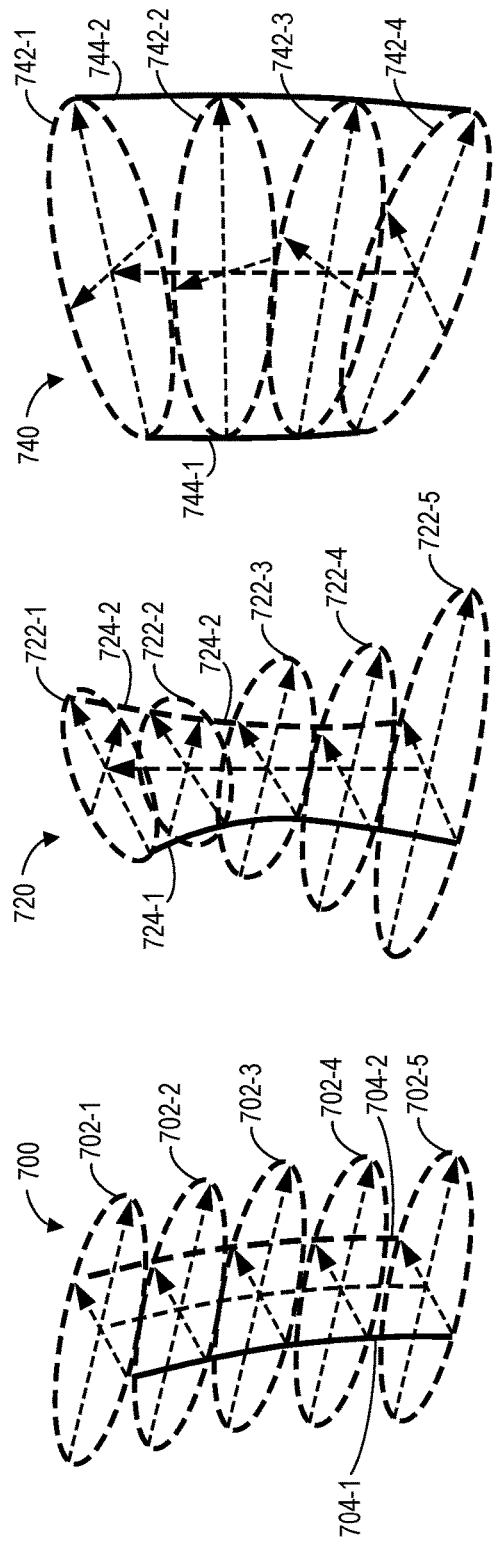

In some embodiments, the image includes a skeleton view of the model in which multiple cross-sections are connected by contour lines (e.g., the contour lines intersect corresponding points on the circumference of each cross-section). The skeleton view shows the 3D shape of the model (although not the entire 3D shape, because of the limited number of cross-sections and contour lines) but is to be displayed in 2D. FIGS. 7A-7C show images 700, 720, and 740 of skeleton views of modeled memory holes in accordance with some embodiments.

In the image 700, cross-sections 702-1 through 702-5 are connected by contour lines 704-1 and 704-2. The cross-sections 702 are elliptical, as shown by the major and minor axes of the ellipses for the cross-sections 702. The elliptical shape of the memory hole, as quantified by its ellipticity (e.g., the ratio of the lengths of the major and minor axes) remains constant as a function of depth, as does the memory-hole CD and thus its size. The memory hole is not helical: the ellipses of the cross-sections 702 do not rotate as a function of depth. The memory hole does have tilt, however, which varies as a function of depth, as shown by the curvature of the contour lines 704-1 and 704-2.

In the image 720, cross-sections 722-1 through 722-5 are connected by contour lines 724-1 and 724-2. The elliptical shape, and thus the ellipticity, changes as a function of depth, with the minor axis increasing in length and becoming the major axis. The size of the memory hole, and thus its CD, change dramatically as a function of depth. The ellipses do not rotate, however, indicating a lack of helicity.

In the image 740, cross-sections 742-1 through 742-4 are connected by contour lines 744-1 and 744-2. While the ellipticity and CD of the cross-sections 742 remains constant, the memory hole shows helicity: the ellipses of the cross-sections 742 rotate with increasing depth. The axes of the ellipses can be seen to rotate.

The use of multiple cross-sections thus can provide extensive information regarding 3D shape, as shown in FIGS. 6 and 7A-7C.

Figure 8A:
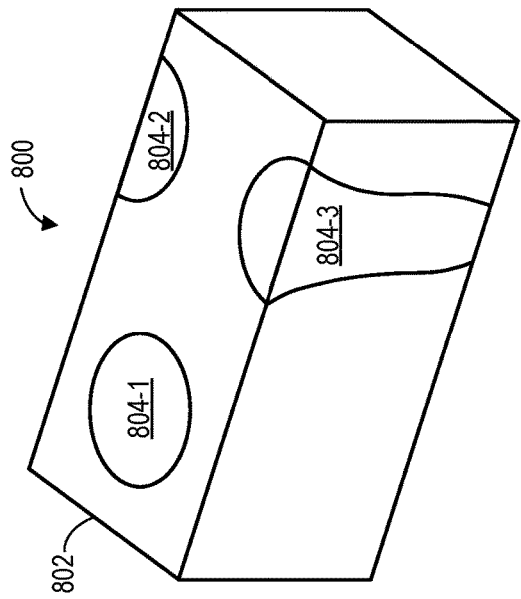
FIGS. 8A and 8B show opaque and translucent images of a modeled volume in a semiconductor with memory holes in accordance with some embodiments.
Figure 8B:
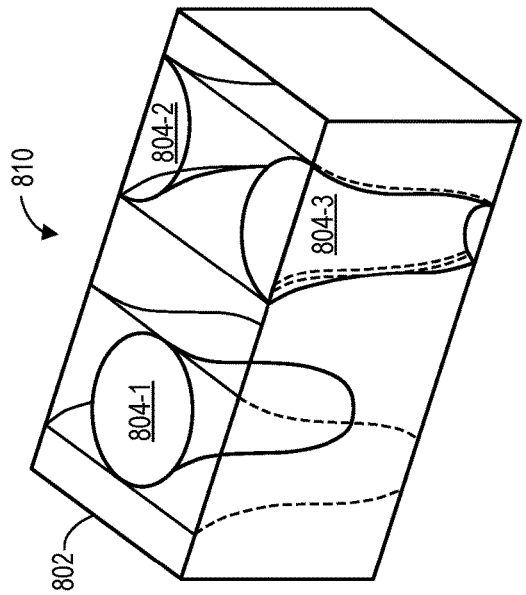

FIGS. 8A and 8B show images 800 and 810 of a modeled volume 802 in a semiconductor in accordance with some embodiments. The volume 802 includes memory holes 804-1, 804-2, and 804-3, which may be part of a periodic 2D arrangement of memory holes. In the image 800, the volume 802 is shown as opaque. The image 800 shows the top surface of the memory hole 804-1, a portion of the top surface of the memory hole 804-2, and a portion of the top surface of the memory hole 804-3 along with a cross-sectional vertical profile of the memory hole 804-3. In the image 810, the volume 802 is translucent and 3D shapes of all three memory holes 804-1, 804-2, and 804-3 are visible. Accordingly, both the images 800 and 810 show at least a partial 3D shape of at least one semiconductor structure (as modeled in step 208), but the image 810 shows significantly more 3D information than the image 800.

Figure 9:
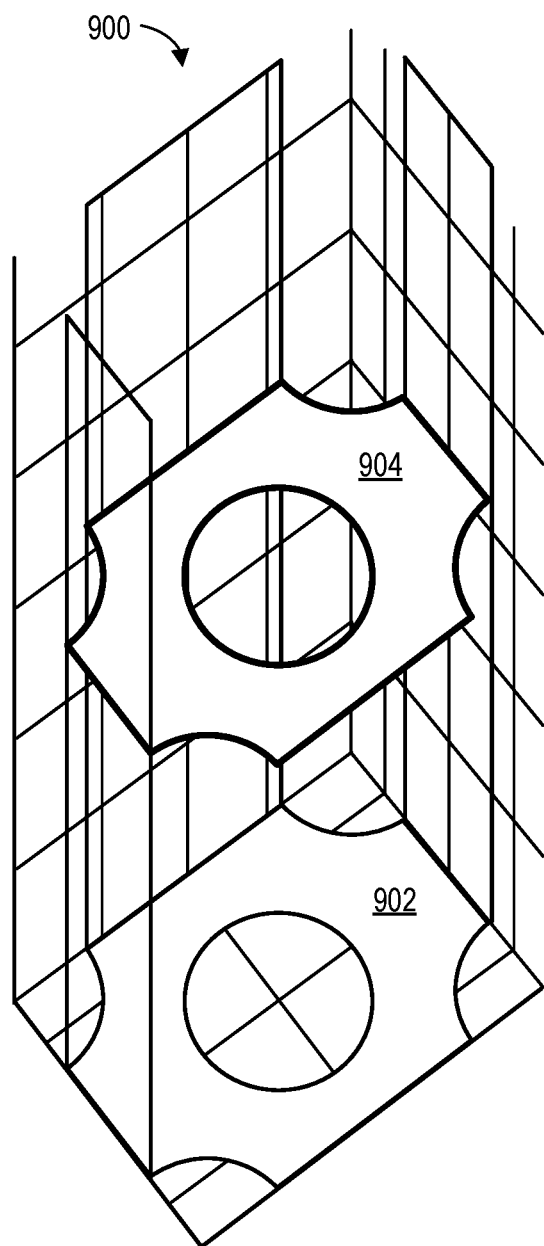
FIG. 9 shows an image that includes a bottom surface and a user-selectable cross-section of a modeled memory hole in accordance with some embodiments.

In some embodiments, the image includes at least one of a top surface or a bottom surface of the modeled respective instance of the 3D semiconductor structure and also includes a user-selectable cross-section (e.g., a horizontal cross-section perpendicular to the vertical z-axis) of the modeled respective instance of the 3D semiconductor structure between the top and bottom surfaces. For example, FIG. 9 shows an image 900 that includes a bottom surface 902 and a user-selectable cross-section 904 of a modeled memory hole in accordance with some embodiments. The user-selectable cross-section 904 may be translucent. The vertical position of the user-selectable cross-section 904 may vary based on user input 226 (e.g., in response to user input 226 specifying a new vertical position, the computer performing the method 200 repeats steps 218 and 220 to render and provide a new image with the user-selectable cross-section 904 in the newly specified vertical position). By providing multiple cross-sections (i.e., the top and/or bottom surface and the user-selectable cross-section), the image shows the 3D shape of the model (but not the entire 3D shape, because of the limited number of cross-sections and contour lines), although the image may be for 2D display. In some embodiments, the image includes multiple user-selectable cross-sections, one or more (e.g., all) of which may be translucent.

In some embodiments, the image is or includes (222) an AR/VR image or a 3D stereoscopic image. The device to which the image is provided in step 224 thus may be an AR/VR viewing device (e.g., AR/VR goggles; AR glasses) or a 3D stereographic viewer.

For example, the AR/VR image is a first AR/VR image of the model rendered from a first perspective. The method 200 further includes, after sending the first AR/VR image to the AR/VR viewing device for display, receiving user input 226 requesting a change in perspective. In response to the user input, step 222 is repeated, such that a second AR/VR image of the model is rendered from a second perspective. The second AR/VR image is sent to the AR/VR viewing device for display, per step 224. In this manner, the user may effectively move around the image in AR/VR.

In another example, the AR/VR image is a first AR/VR image of the model with an appearance that corresponds to values of a parameter of the model as determined based on measurements collected during the inspection of step 202. The method 200 further includes, after sending the first AR/VR image to the AR/VR viewing device for display, receiving user input 226 requesting a change to the values of the parameter. In response to the user input, the values of the parameter for the model are changed and a second AR/VR image of the model is rendered per step 222 with an appearance that corresponds to the changed values. The second AR/VR image is sent to the AR/VR viewing device for display, per step 224. In this manner, the user may explore potential variation in the 3D shape of the semiconductor structure (e.g., explore how much margin the semiconductor structure has before reaching a point of failure).

In some embodiments, an image generated in accordance with the method 200 shows (e.g., highlights) the uncertainty associated with its 3D shape according to the model of step 218. For example, to the extent that there is uncertainty in the CD, a region of uncertainty at the sides of the relevant modeled semiconductor-structure instance (e.g., along the walls of a memory hole) could be shown in a different color, shade, or fill pattern than the rest of the relevant modeled semiconductor-structure instance, thus indicating the uncertainty in the precise location of the sides. Blurring (e.g., of edges) or dots may be used to indicate uncertainty. An animation may be shown in which the 3D shape is shown to vary (e.g., positions of edges vary) through a range of possibilities, in accordance with the uncertainty. Other examples are possible.

Metrics described above, such as tilt, ellipticity, deviation from a nominal shape (e.g., an elliptical shape), and helicity, are merely examples of metrics that may be shown in an image generating using the method 200. Other metrics (e.g., derivative metrics, metrics generated using a Fourier transform, etc.) may also or alternatively be shown.

In some embodiments, an image generated in accordance with the method 200 includes an animation that successively shows successive portions of the 3D shape. For example, the animation may successively show successive cross-sections, such as cross-sections of increasing or decreasing depth. In another example, the animation shows rotation of the 3D shape, with successive portions rotating into and out of view.

In some embodiments, data for the model may be overlaid on the image of the model, such that the image provided to a user's device in step 224 includes the overlaid data. The data may include numbers that specify values of one or more parameters/metrics for the model. The data may include vectors that specify the electric field or strain. Other examples are possible.

The images shown in FIGS. 3A-8 are merely examples of 3D visualization techniques that may be used in the method 200. Other examples are possible. In some embodiments, images produced by the method 200 are used to predict the performance of a semiconductor device. In some embodiments, images produced by the method 200 are used to make comparisons to reference images (e.g., CD-SEM or TEM images). In some embodiments, images produced by the method 200 are used to identify process or design changes.

FIG. 10 is a block diagram of a semiconductor-inspection system 1000 in accordance with some embodiments. The semiconductor-inspection system 1000 includes a semiconductor metrology tool 1032 and a computer system with one or more processors 1002 (e.g., CPUs and/or GPUs), optional user interfaces 1006, memory 1010, and one or more communication buses 1004 interconnecting these components. The computer system may be communicatively coupled with the metrology tool 1032 through one or more networks 1030. The computer system may further include one or more network interfaces (wired and/or wireless, not shown) for communicating with the metrology tool 1032 and/or remote computer systems. In some embodiments, the metrology tool 1032 performs optical metrology and/or SAXS.

The user interfaces 1010 may include a display 1008 and/or one or more input devices (e.g., a keyboard, mouse, touch-sensitive surface of the display 1008, etc.). The display 1008 may display the image of the method 200 in accordance with some embodiments.

Memory 1010 includes volatile and/or non-volatile memory. Memory 1010 (e.g., the non-volatile memory within memory 1010) includes a non-transitory computer-readable storage medium. Memory 1010 optionally includes one or more storage devices remotely located from the processors 1002 and/or a non-transitory computer-readable storage medium that is removably inserted into the computer system. In some embodiments, memory 1010 (e.g., the non-transitory computer-readable storage medium of memory 1010) stores the following modules and data, or a subset or superset thereof: an operating system 1012 that includes procedures for handling various basic system services and for performing hardware-dependent tasks, a model-generation module 1014, a model-updating module 1016, an image-rendering module 1018, an image-transmission module 1020, and a database 1022 of measurements collected from the metrology tool 1032.

The memory 1010 (e.g., the non-transitory computer-readable storage medium of the memory 1010) thus includes instructions for performing the method 200 (FIG. 2) in conjunction with the metrology tool 1032. Each of the modules stored in the memory 1010 corresponds to a set of instructions for performing one or more functions described herein. Separate modules need not be implemented as separate software programs. The modules and various subsets of the modules may be combined or otherwise re-arranged. In some embodiments, the memory 1010 stores a subset or superset of the modules and/or data structures identified above.

FIG. 10 is intended more as a functional description of the various features that may be present in a semiconductor-inspection system than as a structural schematic. For example, the functionality of the computer system in the semiconductor-inspection system 1000 may be split between multiple devices. A portion of the modules stored in the memory 1010 may alternatively be stored in one or more other computer systems communicatively coupled with the computer system of the semiconductor-inspection system 1000 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method of semiconductor-structure visualization, comprising,
   in a semiconductor metrology tool:
      on a semiconductor wafer comprising at least one of semiconductor logic circuitry or semiconductor memory circuitry, inspecting an area of the semiconductor wafer that includes a plurality of instances of a three-dimensional (3D) semiconductor structure arranged periodically in at least one dimension; and
   in a computer system comprising one or more processors and memory storing instructions for execution by the one or more processors:
      based on the inspecting, generating a model of a respective instance of the 3D semiconductor structure;
      rendering an augmented-reality or virtual-reality (AR/VR) image of the model that shows a 3D shape of the model; and
      providing the AR/VR image to an AR/VR viewing device for display.

2. The method of claim 1, wherein the AR/VR image is a first AR/VR image of the model rendered from a first perspective, the method further comprising, after sending the first AR/VR image to the AR/VR viewing device for display:
   receiving user input requesting a change in perspective;
   in response to the user input, rendering a second AR/VR image of the model from a second perspective; and sending the second AR/VR image to the AR/VR viewing device for display.

3. The method of claim 1, wherein the AR/VR image is a first AR/VR image of the model with an appearance that corresponds to values of a parameter of the model as determined based on measurements collected during the inspecting, the method further comprising, after sending the first AR/VR image to the AR/VR viewing device for display:
receiving user input requesting a change to the values of the parameter;
in response to the user input, making the change to the values of the parameter for the model;
rendering a second AR/VR image of the model with an appearance that corresponds to the change; and
sending the second AR/VR image to the AR/VR viewing device for display.

4. The method of claim 1, wherein the AR/VR image shows uncertainty for the 3D shape in the model.

5. The method of claim 1, wherein the AR/VR image indicates deviation of the 3D shape or a cross-section of the 3D shape from a nominal shape.

6. The method of claim 1, wherein the AR/VR image comprises an animation of the 3D shape that successively shows successive portions of the 3D shape.

7. The method of claim 6, wherein the animation shows rotation of the 3D shape.

8. The method of claim 1, wherein the rendering comprises overlaying data for the model on the AR/VR image.

9. The method of claim 1, wherein:
the plurality of instances of the 3D semiconductor structure comprises a periodic arrangement of memory holes in a 3D memory; and
the respective instance of the 3D semiconductor structure comprises a respective memory hole.

10. The method of claim 9, wherein the AR/VR image shows an elliptical shape of the respective memory hole.

11. The method of claim 10, wherein the AR/VR image shows the helicity for the elliptical shape, wherein the helicity indicates change in orientation of the elliptical shape.

12. The method of claim 9, wherein the AR/VR image indicates deviation from an elliptical shape for the respective memory hole.

13. The method of claim 9, wherein the AR/VR image shows tilt of the respective memory hole.

14. The method of claim 1, wherein:
the plurality of instances of the 3D semiconductor structure comprises a periodic arrangement of finFETs; and
the respective instance of the 3D semiconductor structure comprises a respective finFET or a portion of a respective finFET.

15. The method of claim 1, wherein:
the plurality of instances of the 3D semiconductor structure comprises an array of DRAM cells; and
the respective instance of the 3D semiconductor structure comprises a respective DRAM cell or a portion of a respective DRAM cell.

16. The method of claim 1, wherein generating the model of the respective instance of the 3D semiconductor structure comprises:
obtaining a geometric model of the 3D semiconductor structure with parameterized dimensions; and
using measurements collected during the inspecting to determine values of the parameterized dimensions.

17. The method of claim 1, wherein generating the model of the respective instance of the 3D semiconductor structure comprises:
obtaining sets of measurements for varying instances of the 3D semiconductor structure, the sets being labeled with respective values of dimensions; and
performing machine learning, using the sets and measurements collected during the inspecting, to determine values of the dimensions for the respective instance, wherein the generating is performed without using a parameterized geometric model of the 3D semiconductor structure.

18. The method of claim 1, wherein inspecting the area of the semiconductor wafer comprises performing an optical metrology technique selected from the group consisting of spectroscopic ellipsometry, single-wavelength ellipsometry, beam-profile ellipsometry, beam-profile reflectometry, single-wavelength reflectometry, angle-resolved reflectometry, spectroscopic reflectometry, scatterometry, and Raman spectroscopy.

19. The method of claim 1, wherein inspecting the area of the semiconductor wafer comprises performing small-angle x-ray scattering.

20. A semiconductor-inspection system, comprising:
a semiconductor metrology tool;
one or more processors; and
memory storing one or more programs for execution by the one or more processors, the one or more programs comprising instructions for:
based on inspection by the semiconductor metrology tool of an area of a semiconductor wafer that includes a plurality of instances of a three-dimensional (3D) semiconductor structure arranged periodically, generating a model of a respective instance of the 3D semiconductor structure;
rendering an augmented-reality or virtual-reality (AR/VR) image of the model that shows a 3D shape of the model; and
providing the AR/VR image to an AR/VR viewing device for display.

21. A non-transitory computer-readable storage medium storing one or more programs for execution by one or more processors of a computer system, the one or more programs including instructions for:
based on inspection by a semiconductor metrology tool of an area of a semiconductor wafer that includes a plurality of instances of a three-dimensional (3D) semiconductor structure arranged periodically, generating a model of a respective instance of the 3D semiconductor structure;
rendering an augmented-reality or virtual-reality (AR/VR) image of the model that shows a 3D shape of the model; and
providing the AR/VR image to an AR/VR viewing device for display.

* * * * *